US012796501B2

(12) United States Patent
Chen et al.

(10) Patent No.: US 12,796,501 B2
(45) Date of Patent: Nov. 10, 2026

(54) RF CIRCUIT DEVICE WITH ULTRA THICK METAL AND ROUTING MESH

(71) Applicant: Taiwan Semiconductor Manufacturing Company, Ltd., Hsinchu (TW)

(72) Inventors: Wen-Sheng Chen, Hsinchu (TW); Wei-Ling Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 485 days.

(21) Appl. No.: 18/234,572

(22) Filed: Aug. 16, 2023

(65) Prior Publication Data

US 2025/0062209 A1 Feb. 20, 2025

(51) Int. Cl.

| | |
|---|---|
| ***H10W 70/65*** | (2026.01) |
| ***H10W 20/40*** | (2026.01) |
| ***H10W 44/20*** | (2026.01) |
| ***H10W 70/66*** | (2026.01) |
| ***H10W 70/685*** | (2026.01) |

(52) U.S. Cl.

CPC ......... *H10W 70/65* (2026.01); *H10W 20/496* (2026.01); *H10W 44/20* (2026.01); *H10W 70/66* (2026.01); *H10W 70/685* (2026.01); *H10W 44/209* (2026.01)

(58) Field of Classification Search

CPC ............................................. H10W 44/00–601

See application file for complete search history.

(56) References Cited

U.S. PATENT DOCUMENTS

| | | | | |
|---|---|---|---|---|
| 6,081,989 A * | 7/2000 | Pluymers | ........... | H01Q 21/0087 29/601 |
| 2021/0233934 A1* | 7/2021 | Gu | ...................... | H10D 86/201 |
| 2023/0420384 A1* | 12/2023 | Nagarajan | ............. | H10W 42/20 |

OTHER PUBLICATIONS

Chen et al., "Ultra-Low-Resistance 3D InFO Inductors for Integrated Voltage Regulator Applications", 2016 IEEE International Electron Devices Meeting (IEDM), pp. IEDM16-882-IEDM16-885.

Hu et al., "3D Multi-chip Integration with System on Integrated Chips (SoIC™)", 2019 Symposium on VLSI Technology, IEEE, pp. T20-T21.

Jeon et al., "Circuit Level Layout Optimization of MOS Transistor for RF and Noise Performance Improvements" IEEE Transactions on Electron Devices, Dec. 2016, vol. 63, No. 12, pp. 4674-4677.

Liao, et al., "3D IC Heterogeneous Integration of GPS RF Receiver, Baseband, and DRAM on CoWoS with System BIST Solution", 2013 Symposium on VLSI Circuits. IEEE, pp. C18-C19.

(Continued)

*Primary Examiner* — William B Partridge
*Assistant Examiner* — Gustavo G Ramallo
(74) *Attorney, Agent, or Firm* — Birch, Stewart, Kolasch & Birch, LLP

(57) ABSTRACT

A semiconductor device and a semiconductor package structure are provided. The semiconductor device includes a Radio Frequency (RF) circuit, at least one Ultra Thick Metal (UTM) layer and at least one aluminum (AP) mesh layer. The UTM layer is stacked on the RF circuit. The aluminum mesh layer is stacked on the UTM layer, and the UTM layer is connected to a power source or a ground through the aluminum mesh layer.

20 Claims, 13 Drawing Sheets

(56) References Cited

OTHER PUBLICATIONS

Oh et al., "Effect of Device Layout on the Stability of RF MOSFETS", IEEE transactions on microwave theory and techniques, May 2013, vol. 61, No. 5, pp. 1861-1869.
Ong et al., "A 22nm FDSOI Technology Optimized for RF/mm Wave Applications", IEEE Radio Frequency Integrated Circuits Symposium (RFIC), 2018, pp. 72-75.
Pastore et al., "High Performance and High Current Integrated Inductors using a Double Ultra Thick Copper Module in an Advanced 65 nm RF CMOS Technology", IEEE Topical Meeting on Silicon Monolithic Integrated Circuits in RF Systems, 2009, pp. 1-4.
Unterweissacher et al., "Stability Analysis of On-Chip Multi-Stage RF Power Amplifiers", IEEE Radio Frequency Integrated Circuits (RFIC) Symposium, 2007, pp. 471-474.
Yu, "TSMC Packaging Technologies for Chiplets and 3D", Proceedings of the 2021 IEEE Hot Chips 33, Total 47 pages.

* cited by examiner

RF CIRCUIT DEVICE WITH ULTRA THICK METAL AND ROUTING MESH

BACKGROUND

The disclosure relates in general to a semiconductor device and a semiconductor package structure, and more particularly to a semiconductor device and a semiconductor package structure including Ultra Thick Metal (UTM).

In a Radio Frequency (RF) circuit device, Ultra Thick Metal (UTM) is used as the power path of the RF circuit device for well current distribution, power integrity and reducing IR-drop. However, when the circuit design/routing becomes more and more complicated, the availability of the UTM is reduced. Therefore, the RF circuit device suffers from the constraint on power/ground routing and the routing in the circuit such as interconnect and passive element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
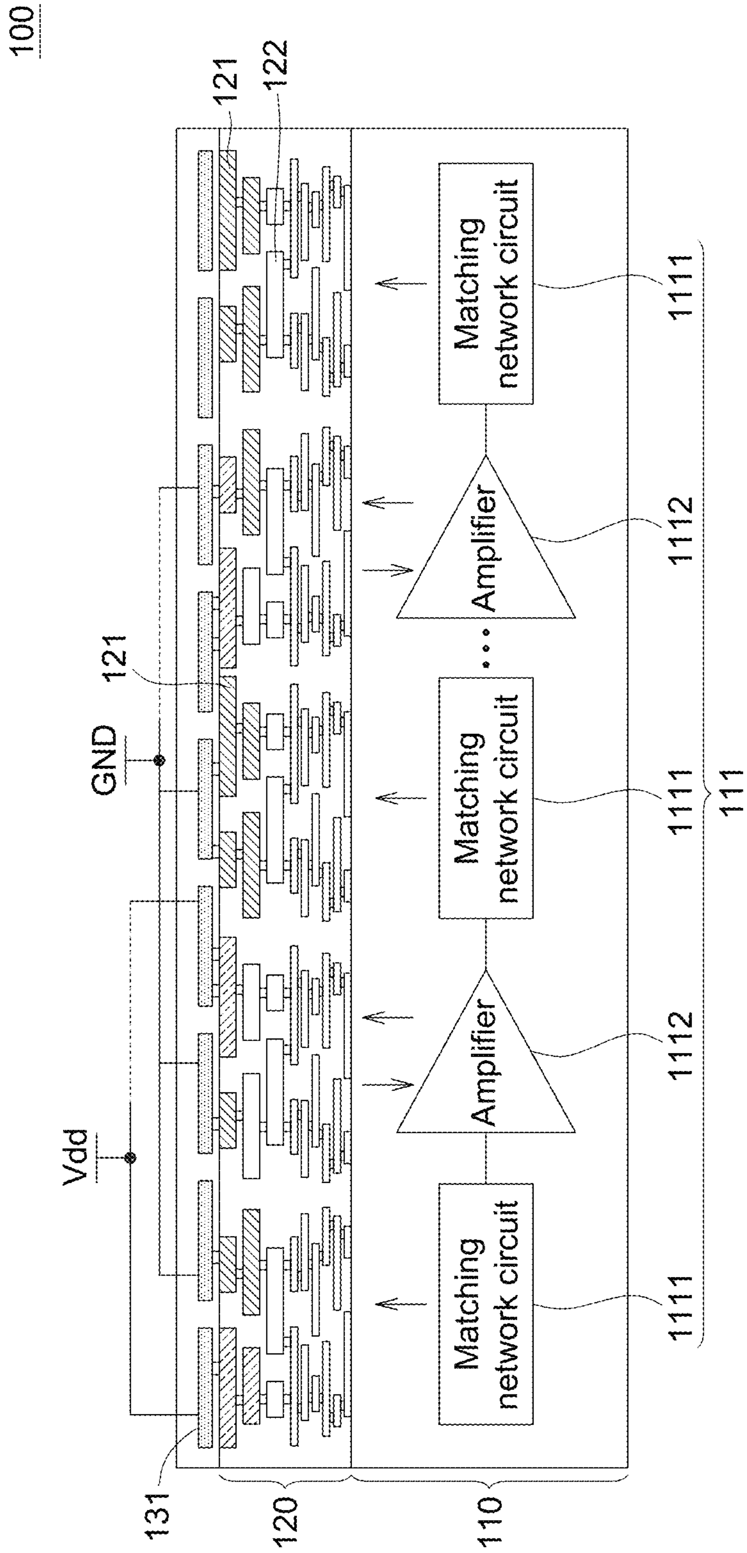
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 100 according to one embodiment. The semiconductor device 100 is, for example, a Radio Frequency (RF) circuit device. For example, the semiconductor device 100 includes a front end of line (FEOL) part 110 and a back end of line (BEOL) part 120. The FEOL part 110 includes, for example, a Radio Frequency (RF) circuit 111 including a plurality of matching network circuit 1111 and a plurality of amplifiers 1112. The BEOL part 120 is formed after the FEOL part 110. The BEOL part 120 includes, for example, at least one Ultra Thick Metal (UTM) layer 121, such as a plurality of top UTM layers and a plurality of sub-UTM layers and at least one passive component 122, such as a plurality of capacitors, stacked on the RF circuit 111.

In some instances, some RF circuit devices employ both general metal layers and UTM layers 121 in which the UTM layers 121 have a greater thickness than the general metal layers. For example, while some general metal layers range from about 1 μm to about 2 μm in thickness, the UTM layers 121 range from about 2 μm to about 4 μm in thickness. In some RF circuit devices, one or more UTM layers 121 are formed over the general metal layers separated by insulating layers except where portions of the metal and UTM layers 121 are connected by one or more vias.

In some embodiments, the general metal layer stacked on the RF circuit 111 forms a portion of an inductor. In other embodiments, the general metal layer stacked on the RF circuit 111 forms a portion of a capacitor. Still in other embodiments, the UTM layer 121 forms a portion of a power line.

In this embodiment, the semiconductor device 100 further includes at least one aluminum (AP) mesh layer 131 stacked on the UTM layer 121. The UTM layer 121 is connected to a power source Vdd or a ground GND through the aluminum mesh layer 131. The thickness of the aluminum mesh layer 131 is 1.4 to 2.8 um. The aluminum mesh layer 131 is extended to some area beyond the UTM layer 121. The aluminum mesh layer 131 connected to the UTM layer 121 could improve the electrical conductivity and reduce the parasitic resistance for power and grounding.

Figure 2:
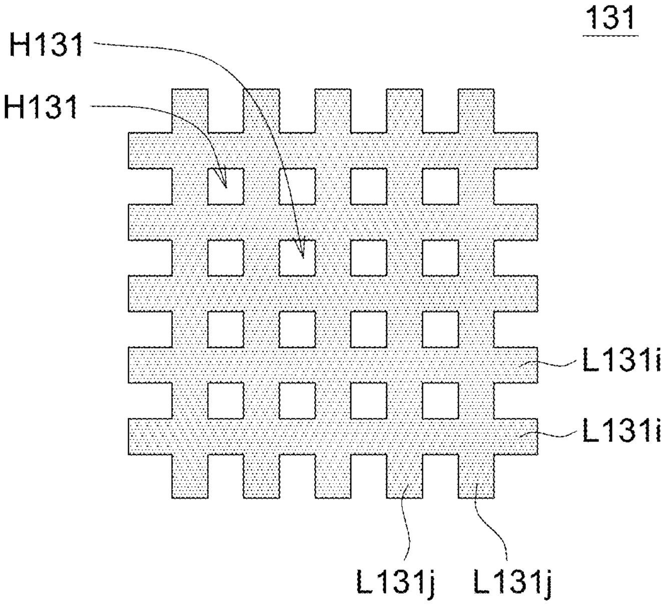
FIG. 2 shows a top view of an aluminum mesh layer according to one embodiment.

Please refer to FIG. 2, which shows a top view of the aluminum mesh layer 131 according to one embodiment. In this embodiment, the aluminum mesh layer 131 is formed as a mesh structure.

For example, the aluminum mesh layer 131 is composed of a plurality of lines L131*i*, L131*j* crossing each other, such that the aluminum mesh layer 131 forms the mesh structure. The lines L131*i* are substantially perpendicular to the lines L131*j*. The lines L131*i* may have substantially identical widths, the lines L131*j* may have substantially identical widths, and the widths of the lines L131*i* and the widths of the lines L131*j* may be substantially identical.

Or, for example, the aluminum mesh layer 131 has a plurality of holes H131 arranged in a matrix, such that the aluminum mesh layer 131 forms the mesh structure. The holes H131 may be rectangular or circular. The holes H131 may have substantially identical sizes.

Figure 3:
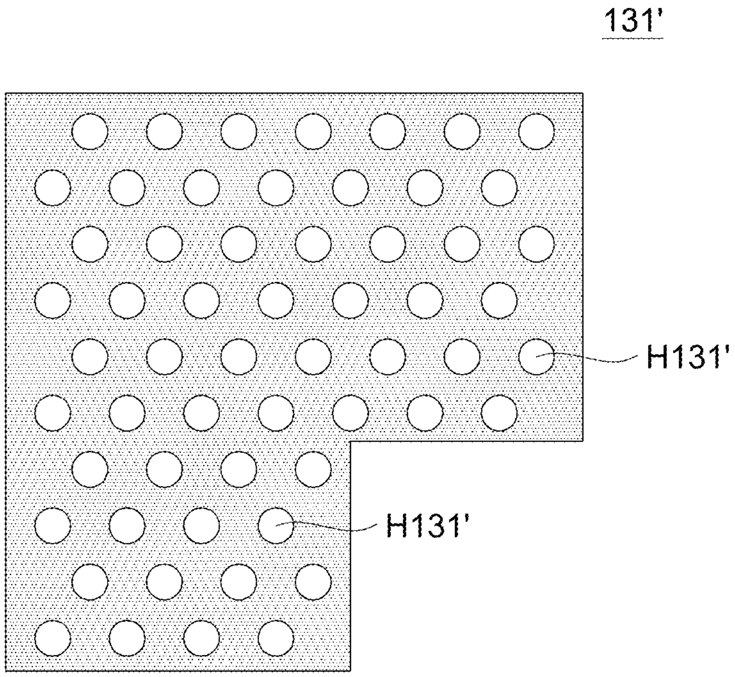
FIG. 3 shows a top view of an aluminum mesh layer according to another embodiment.

The shapes of the holes H131 are not used to limit to the present invention. Please refer to FIG. 3, which shows a top view of an aluminum mesh layer 131' according to another embodiment. In FIG. 3, the holes H131' are circle shaped and the holes H131' are evenly distributed within the aluminum mesh layer 131'.

Figure 4:
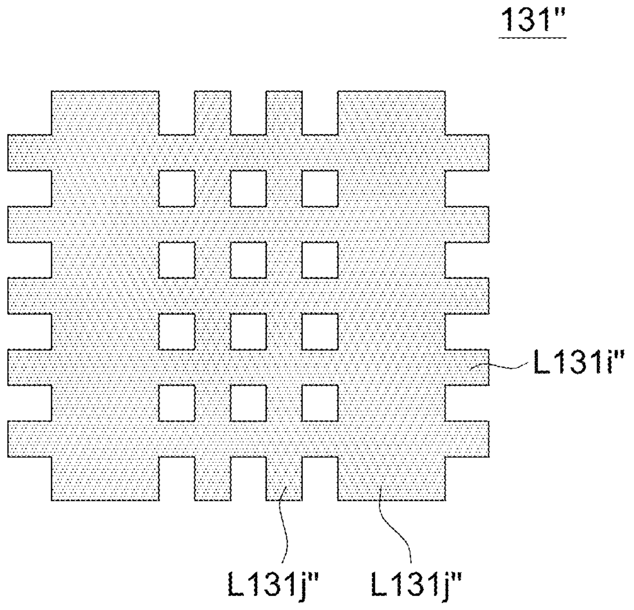
FIG. 4 shows a top view of an aluminum mesh layer according to another embodiment.

The widths of the lines L131*i*, L131*j* are not used to limit to the present invention. Please refer to FIG. 4, which shows a top view of an aluminum mesh layer 131" according to another embodiment. The aluminum mesh layer 131" is composed of a plurality of lines L131*i*", L131*j*" crossing each other, such that the aluminum mesh layer 131" forms the mesh structure. The lines L131*i*" are substantially perpendicular to the lines L131*j*". The lines L131*i*" may have substantially identical widths, and the lines L131*j*" may have different widths.

Figure 5:
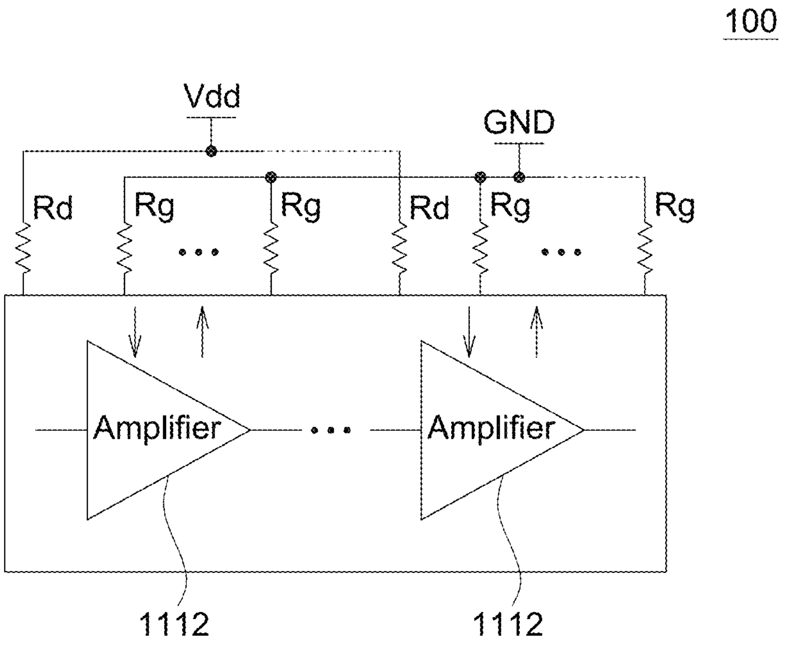
FIG. 5 shows an equivalent circuit diagram of the semiconductor device of FIG. 1.

Please refer to FIG. 5, which shows an equivalent circuit diagram of the semiconductor device 100 of FIG. 1. Because the aluminum mesh layer 131, 131', 131" is stacked on the UTM layer 121, the resistances Rd on the routing to the power source Vdd and the resistances Rg on the routing to the ground GND are reduced. Therefore, the signal transmitted among the amplifiers 1112 could be stabilized. The power performance and the power efficiency would be greatly improved.

Figure 6:
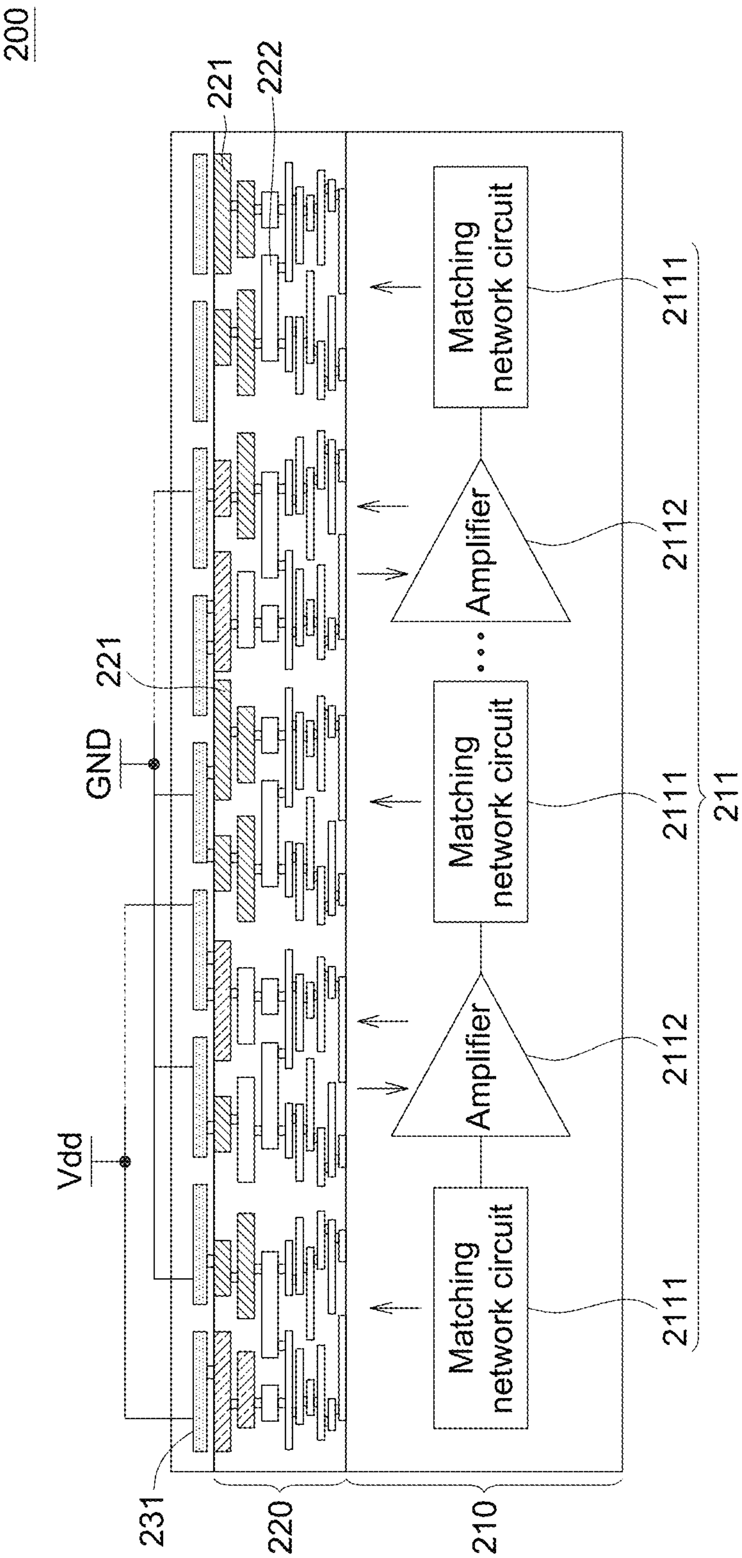
FIG. 6 shows a semiconductor device according to another embodiment.

Please refer to FIG. 6, which shows a semiconductor device 200 according to another embodiment. The semiconductor device 200 is, for example, an RF circuit device. For example, the semiconductor device 200 includes a FEOL part 210 and a BEOL part 220. The FEOL part 210 includes, for example, an RF circuit 211 including a plurality of matching network circuit 2111 and a plurality of amplifiers 2112. The BEOL part 220 is formed after the FEOL part 210. The BEOL part 220 includes, for example, at least one UTM layer 221, such as a plurality of top UTM layers and a plurality of sub-UTM layers and at least one passive component 222, such as a plurality of capacitors, stacked on the RF circuit 211. The thickness of the UTM layer 221 is, for example, 2 to 4 μm. In this embodiment, the semiconductor device 200 further includes at least one copper mesh redistribution layer (RDL) 231 stacked on the UTM layer 221. The UTM layer 221 is connected to the power source Vdd or the ground GND through the copper mesh RDL 231. The thickness of the copper mesh RDL 231 is 2.8 to 5.5 um. The copper mesh RDL 231 is extended to some area beyond the UTM layer 221. The copper mesh RDL 231 connected to the UTM layer 221 could improve the electrical conductivity and reduce the parasitic resistance for power and grounding.

Figure 7:
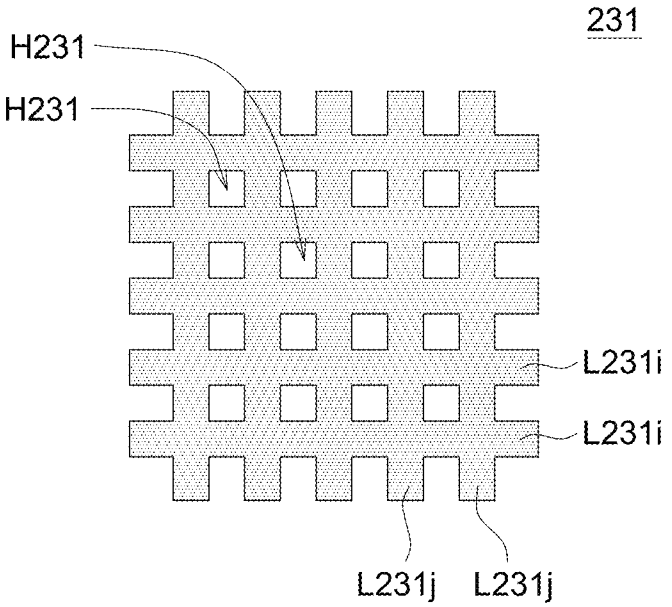
FIG. 7 shows a top view of a copper mesh RDL according to one embodiment.

Please refer to FIG. 7, which shows a top view of the copper mesh RDL 231 according to one embodiment. In this embodiment, the copper mesh RDL 231 is formed as a mesh structure.

For example, the copper mesh RDL 231 is composed of a plurality of lines L231*i*, L231*j* crossing each other, such that the copper mesh RDL 231 forms a mesh structure. The lines L231*i* are substantially perpendicular to the lines L231*j*. The lines L231*i* may have substantially identical widths, the lines L231*j* may have substantially identical widths, and the widths of the lines L231*i* and the widths of the lines L231*j* may be substantially identical.

Or, for example, the copper mesh RDL 231 has a plurality of holes H231 arranged in a matrix, such that the copper mesh RDL 231 forms the mesh structure. The holes H231 may be rectangular or circular. The holes H231 may have substantially identical sizes.

Figure 8:
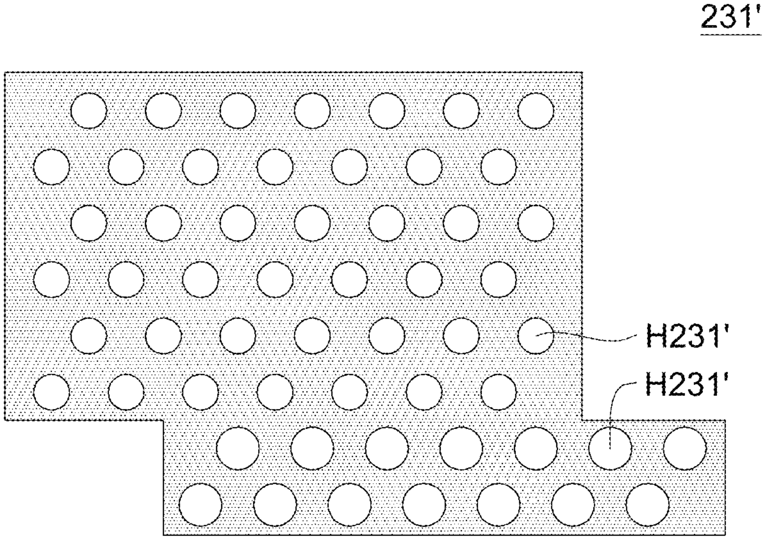
FIG. 8 shows a top view of a copper mesh RDL according to another embodiment.

The shapes of the holes H231 are not used to limit the present invention. Please refer to FIG. 8, which shows a top view of a copper mesh RDL 231' according to another embodiment. In FIG. 8, the holes H231' are circle shaped and the holes H231' are evenly distributed within the copper mesh RDL 231'. The holes H231' may have different sizes.

Figure 9:
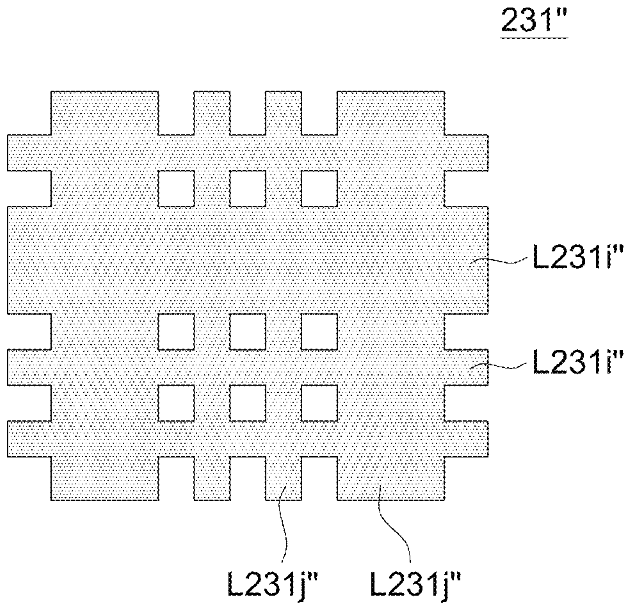
FIG. 9 shows a top view of a copper mesh RDL according to another embodiment.

The widths of the lines L231*i*, L231*j* are not used to limit the present invention. Please refer to FIG. 9, which shows a top view of a copper mesh RDL 231" according to another embodiment. The copper mesh RDL 231" is composed of a plurality of lines L231*i*", L231*j*" crossing each other, such that the copper mesh RDL 231" forms the mesh structure. The lines L231*i*" are substantially perpendicular to the lines L231*j*". The lines L231*i*" may have different widths, and the lines L231*j*" may have different widths.

Figure 10:
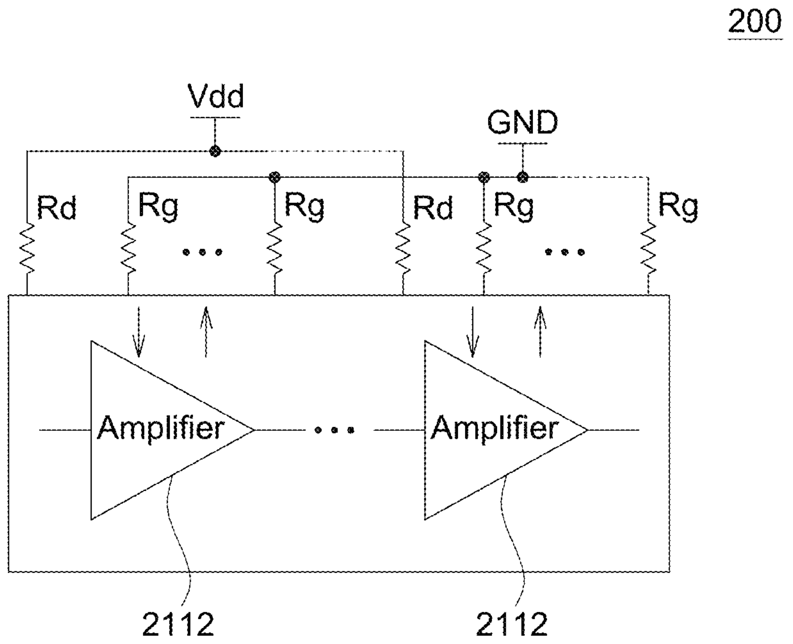
FIG. 10 shows an equivalent circuit diagram of the semiconductor device of FIG. 6.

Please refer to FIG. 10, which shows an equivalent circuit diagram of the semiconductor device 200 of FIG. 6. Because the copper mesh RDL 231, 231', 231" with the mesh structure is stacked on the UTM layer 221, the resistances Rd on the routing to the power source Vdd and the resistances Rg on the routing to the ground GND are reduced. Therefore, the signal transmitted among the amplifiers 2112 could be stabilized. The power performance and the power efficiency would be greatly improved.

Please referring to the following table I, the performances of the amplifiers in the semiconductor device with/without the aluminum mesh layer or the copper mesh RDL are shown.

TABLE I

| The performance of the amplifiers | The semiconductor device without the aluminum mesh layer or the copper mesh RDL | The semiconductor device with the aluminum meshl ayer or the copper mesh RDL |
|---|---|---|
| Gain (dB) | 30.1 | 30.3 (x1.05) |
| OP1dB (dB) | 19.7 | 20.2 (xx1.12) |
| PAE@OP1dB (%) | 31 | 32 (x1.03) |
| Stability factor (k) @ operating frequency | 2.0 | 6 (x29) |

"OP1 dB" is the output power level at which the gain decreases 1 dB from its constant value, which represents an index of linearity of a circuit. "PAE" is the power added efficiency defined as the ratio of the difference of the output and input signal power to the DC power consumed. As shown in the table I, the stability factor (k) could be greatly enhanced from 2.0 to 57.6 by using consolidated power mesh. Moreover, PA performance (gain, OP1 dB, PAE@OP1 dB) can be enhanced as well by using consolidated power mesh.

Figure 11:
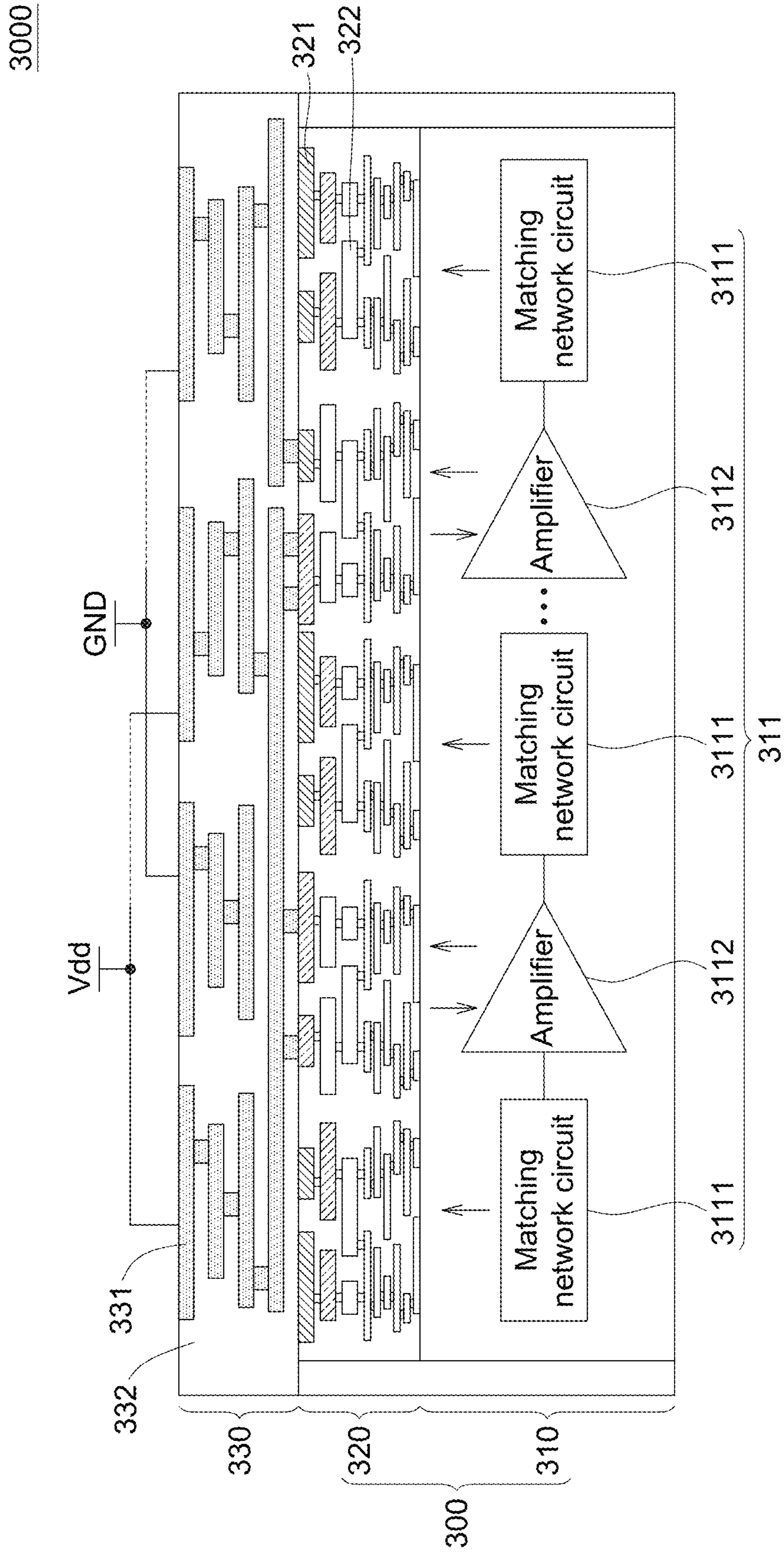
FIG. 11 shows a semiconductor device according to another embodiment.

Please refer to FIG. 11, which shows a semiconductor package structure 3000 according to another embodiment. The semiconductor package structure 3000 includes a semiconductor device 300 and an interposer 330. The semiconductor package structure 3000 is a 3D integrated circuit package structure. For example, the semiconductor device 300 is packaged via the Integrated Fan-out (InFO) technology or the Chip-on-Wafer-on-Substrate (CoWoS) technology. The interposer 330 is used for connecting the semiconductor device 300 to other semiconductor device or to a package substrate. The semiconductor device 300 is, for example, an RF circuit device. The interposer 330 includes, for example, a plurality of routing mesh layers 331 and a modeling material 332. The routing mesh layers 331 are stacked in several layers.

The semiconductor device 300 includes a FEOL part 310 and a BEOL part 320. The FEOL part 310 includes, for example, an RF circuit 311 including a plurality of matching network circuit 3111 and a plurality of amplifiers 3112. The BEOL part 320 is formed after the FEOL part 310. The BEOL part 320 includes, for example, at least one UTM layer 321, such as a plurality of top UTM layers and a plurality of sub-UTM layers and at least one passive component 322, such as a plurality of capacitors, stacked on the RF circuit 311. The thickness of the UTM layer 321 is, for example, 2 to 4 um.

The UTM layer 321 is connected to the power source Vdd or the ground GND through the routing mesh layer 331. The routing mesh layer 331 connected to the UTM layer 321 could improve the electrical conductivity and reduce the parasitic resistance for power and grounding.

Figure 12:
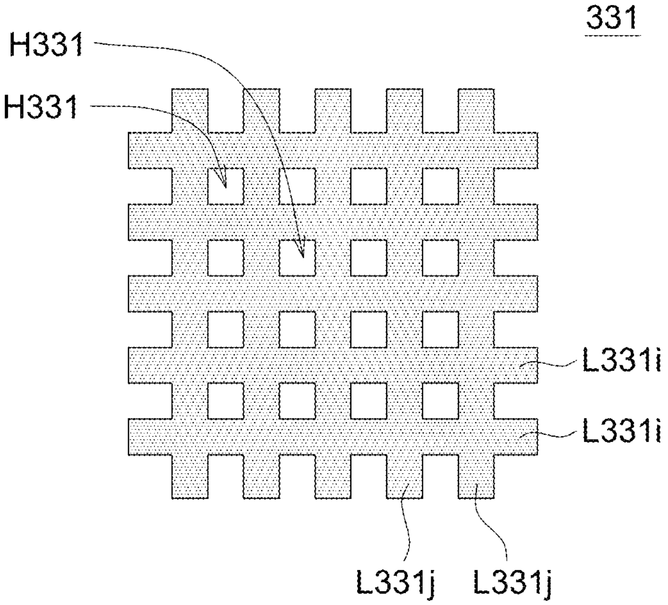
FIG. 12 shows a top view of a routing mesh layer according to one embodiment.

Please refer to FIG. 12, which shows a top view of the routing mesh layer 331 according to one embodiment. In this embodiment, the routing mesh layer 331 is formed as a mesh structure.

For example, the routing mesh layer 331 is composed of a plurality of lines L331*i*, L331*j* crossing each other, such that the routing mesh layer 331 forms the mesh structure. The lines L331*i* are substantially perpendicular to the lines L331*j*. The lines L331*i* may have substantially identical widths, the lines L331*j* may have substantially identical widths, and the widths of the lines L331*i* and the widths of the lines L331*j* may be substantially identical.

Or, for example, the routing mesh layer 331 has a plurality of holes H331 arranged in a matrix, such that the routing mesh layer 331 forms the mesh structure. The holes H331 may be rectangular or circular. The holes H331 may have substantially identical sizes.

Figure 13:
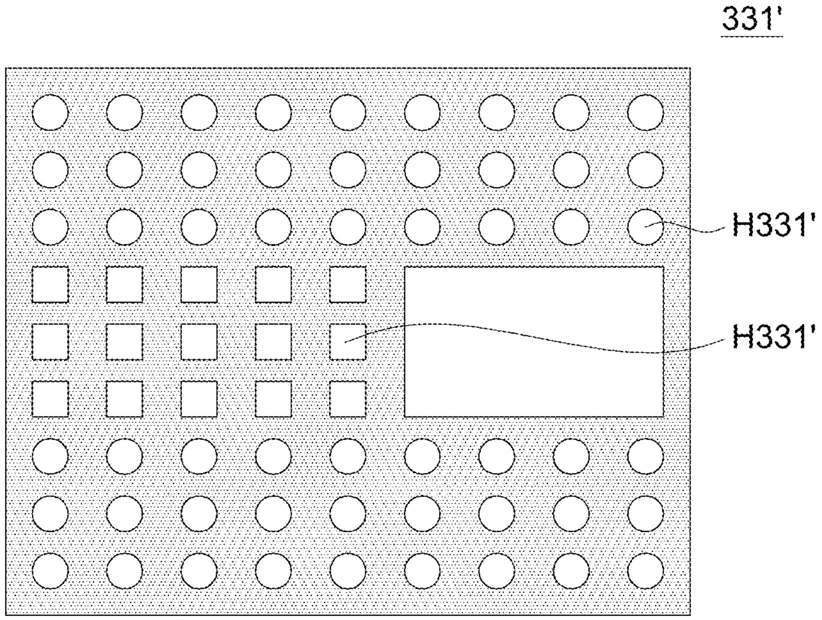
FIG. 13 shows a top view of a routing mesh layer according to another embodiment.

The shapes of the holes H331 are not used to limit the present invention. Please refer to FIG. 13, which shows a top view of a routing mesh layer 331' according to another embodiment. In FIG. 13, some of the holes H331' are circle shaped, some of the holes H331' are rectangle shaped, and the holes H331' are evenly distributed within the routing mesh layer 331'. The holes H331' may have different sizes.

Figure 14:
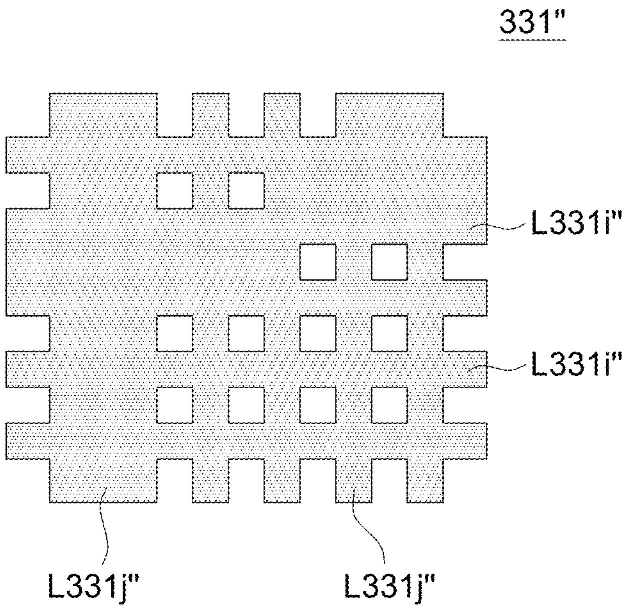
FIG. 14 shows a top view of a routing mesh layer according to another embodiment.

The widths of the lines L331*i*, L331*j* are not used to limit the present invention. Please refer to FIG. 14, which shows a top view of a routing mesh layer 331" according to another embodiment. The routing mesh layer 331" is composed of a plurality of lines L331*i*", L331*j*" crossing each other, such that the routing mesh layer 331" forms the mesh structure. The lines L331*i*" are substantially perpendicular to the lines L331*j*". The lines L331*i*" may have different widths, and the lines L331*j*" may have different widths. One of the lines L331*i*" may have varied width, and one of the lines L331*j*" may have varied width.

Figure 15:
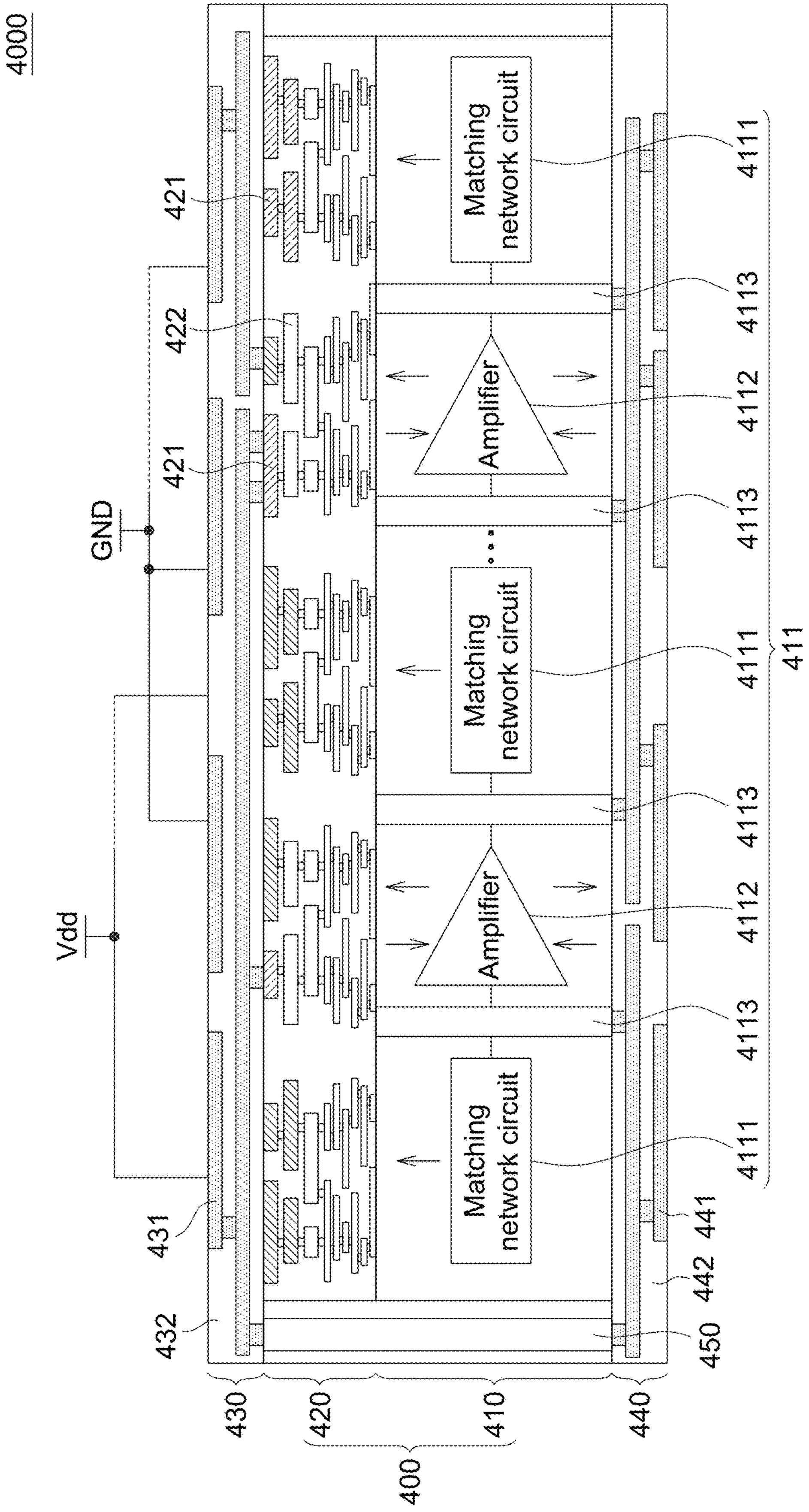
FIG. 15 shows a semiconductor package structure according to another embodiment.

Please refer to FIG. 15, which shows a semiconductor package structure 4000 according to another embodiment. The semiconductor package structure 4000 includes a semiconductor device 400, two interposers 430, 440 and at least one Through-Interposer-Via (TIV) 450. The semiconductor package structure 4000 is a 3D integrated circuit package structure. For example, the semiconductor device 400 is packaged via the Integrated Fan-out (InFO) technology or the Chip-on-Wafer-on-Substrate (CoWoS) technology. The interposers 430, 440 are used for connecting the semiconductor device 400 to other semiconductor device or to a package substrate. The interposer 430 is formed on the front side of the semiconductor device 400, and the interposer 440 is formed on the back side of the semiconductor device 400. The TIV 450 is used to connect the routing mesh layer 431 and the routing mesh layer 432. The semiconductor device 400 is, for example, an RF circuit device. The interposer 430 includes, for example, a plurality of routing mesh layers 431 and a modeling material 432. The routing mesh layers 431 are stacked in several layers. The interposer 440 includes, for example, a plurality of routing mesh layers 441 and a modeling material 442. The routing mesh layers 441 are stacked in several layers.

The semiconductor device 400 includes a FEOL part 410 and a BEOL part 420. The FEOL part 410 includes, for example, an RF circuit 411 including a plurality of matching network circuit 4111, a plurality of amplifiers 4112 and a plurality of through silicon via (TSV) 4113. The BEOL part 420 is formed after the FEOL part 410. The BEOL part 420 includes, for example, at least one UTM layer 421, such as a plurality of top UTM layers and a plurality of sub-UTM layers and at least one passive component 422, such as a plurality of capacitors, stacked on the RF circuit 411. The thickness of the UTM layer 421 is, for example, 2 to 4 um.

The UTM layer 421 is connected to the power source Vdd or the ground GND through the routing mesh layers 431, 441. The routing mesh layers 431, 441 connected to the UTM layer 421 could improve the electrical conductivity and reduce the parasitic resistance for power and grounding.

Figure 16:
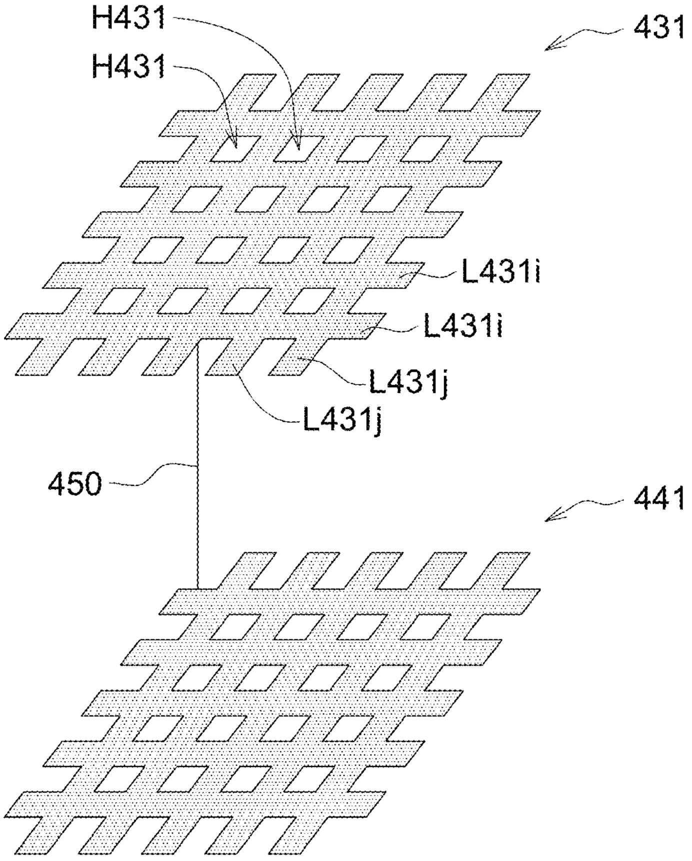
FIG. 16 shows a plurality of routing mesh layers and a TIV according to one embodiment.

Please refer to FIG. 16, which shows the routing mesh layers 431, 441 and the TIV 450 according to one embodiment. In this embodiment, the routing mesh layers 431, 441 are formed as mesh structures.

For example, the routing mesh layer 431 is composed of a plurality of lines L431*i*, L431*j* crossing each other, such that the routing mesh layer 431 forms the mesh structure. The lines L431*i* are substantially perpendicular to the lines L431*j*. The lines L431*i* may have substantially identical widths, the lines L431*j* may have substantially identical widths, and the widths of the lines L431*i* and the widths of the lines L431*j* may be substantially identical.

Or, for example, the routing mesh layer 431 has a plurality of holes H431 arranged in a matrix, such that the routing mesh layer 431 forms the mesh structure. The holes H431 may be rectangular or circular. The holes H431 may have substantially identical sizes.

The shapes of the holes H431 are not used to limit the present invention. In other embodiments, the holes (not shown) may have different sizes.

Further, the widths of the lines L431*i*, L431*j* are not used to limit the present invention. In other embodiments, the lines may have different widths.

Figure 17:
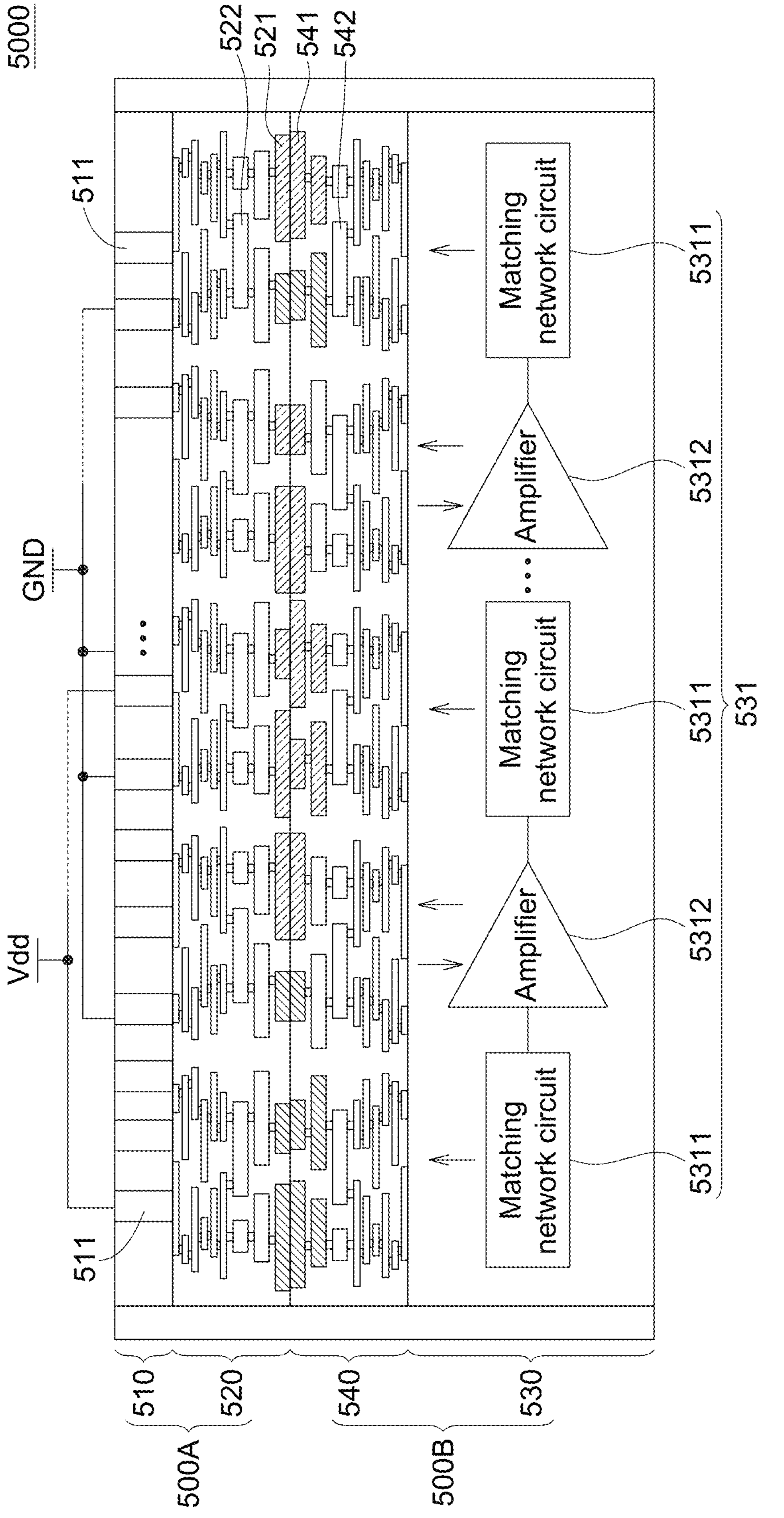
FIG. 17 shows a 3D semiconductor structure according to another embodiment.

Please refer to FIG. 17, which shows a 3D semiconductor structure 5000 according to another embodiment. The 3D semiconductor structure 5000 includes a semiconductor device 500A and a semiconductor device 500B. The semiconductor device 500A and the semiconductor device 500B are stacked via the System-on-Integrated-Chips (SoIC) technology. For example, the semiconductor device 500A is a through-silicon-via TSV module, and the semiconductor device 500B is an RF circuit device. The front sides of the semiconductor device 500A and the semiconductor device 500B are bonded face to face.

The semiconductor device 500A includes a FEOL part 510 and a BEOL part 520. The FEOL part 510 includes a plurality of TSVs 511. The BEOL part 520 is formed after the FEOL part 510. The BEOL part 520 includes, for example, at least one UTM mesh layer 521, such as a plurality of top UTM layers and a plurality of sub-UTM layers and at least one passive component 522, such as a plurality of capacitors. The thickness of the UTM mesh layer 521 is, for example, 2 to 4 um.

The semiconductor device 500B includes a FEOL part 530 and a BEOL part 540. The FEOL part 530 includes, for example, an RF circuit 531 including a plurality of matching network circuit 5311 and a plurality of amplifiers 5312. The BEOL part 540 is formed after the FEOL part 530. The BEOL part 540 includes, for example, at least one UTM layer 541, such as a plurality of top UTM layers and a plurality of sub-UTM layers and at least one passive component 542, such as a plurality of capacitors, stacked on the RF circuit 531. The thickness of the UTM layer 541 is, for example, 2 to 4 um.

The UTM mesh layer 521 and the UTM layer 541 are connected to the power source Vdd or the ground GND through the TSVs 511. The UTM mesh layer 521 connected to the UTM layer 541 could improve the electrical conductivity and reduce the parasitic resistance for power and grounding.

Figure 18:
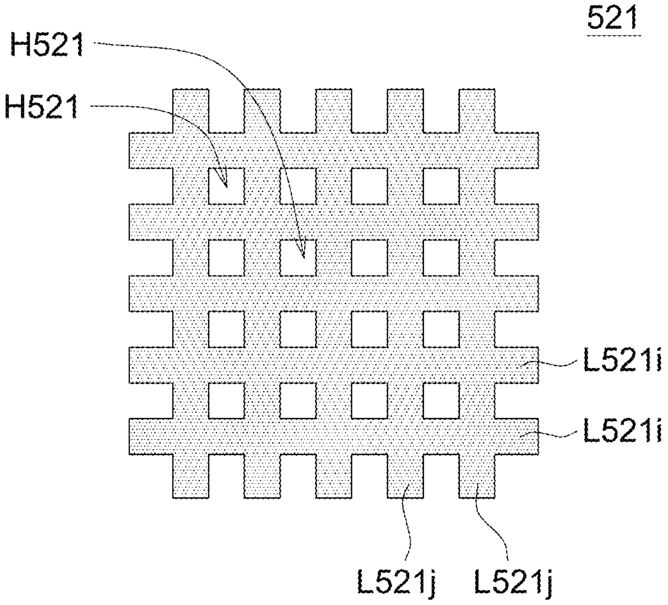
FIG. 18 shows a top view of a UTM mesh layer according to one embodiment.

Please refer to FIG. 18, which shows a top view of the UTM layer 521 according to one embodiment. In this embodiment, the UTM mesh layer 521 is formed as a mesh structure.

For example, the UTM mesh layer 521 is composed of a plurality of lines L521*i*, L521*j* crossing each other, such that the UTM mesh layer 521 forms the mesh structure. The lines L521*i* are substantially perpendicular to the lines L521*j*. The lines L521*i* may have substantially identical widths, the lines L521*j* may have substantially identical widths, and the widths of the lines L521*i* and the widths of the lines L521*j* may be substantially identical.

Or, for example, the UTM mesh layer 521 has a plurality of holes H521 arranged in a matrix, such that the UTM mesh layer 521 forms the mesh structure. The holes H521 may be rectangular or circular. The holes H521 may have substantially identical sizes.

The shapes of the holes H521 are not used to limit the present invention. In other embodiments, the holes (not shown) may have different sizes.

Further, the widths of the lines L521*i*, L521*j* are not used to limit the present invention. In other embodiments, the lines may have different widths.

According to the embodiments described above, the UTM layer 121, 221, 321, 421, 541 stacked on (or connected to) the aluminum mesh layer 131, the copper mesh RDL 231, the routing mesh layer 331, the routing mesh layer 431 and the UTM mesh layer 521 can substantially reduce parasitic resistance for power & grounding.

Besides, the routing mesh layers 331, 431, 441 with a multilayer structure could further reduce parasitic resistance because 3DIC has more routing resource (More layer, more metal scheme, and more flexibility of design rule check).

Furthermore, the matching network circuit 1111, 2111, 3111, 4111, 5311 could be implemented by UTM or InFO/CoWoS with high design flexibility to obtain a high quality passive element for circuit performance.

By the consolidated power mesh in 3DIC RF circuit, the current distribution, power integrity, and IR drop problem could be solved, and it has the potential to improve circuit performances such as stability, power efficiency, power performance, and reliability especially for high power circuit.

This disclosure covers the possibility of nowadays AP/Cu-RDL & packaging technology for integrated circuit. It has the design flexibility for wide range of solutions.

Example embodiment 1: A semiconductor device is provided. The semiconductor device includes a Radio Frequency (RF) circuit, at least one Ultra Thick Metal (UTM) layer and at least one aluminum (AP) mesh layer. The UTM layer is stacked on the RF circuit. The aluminum mesh layer is stacked on the UTM layer, and the UTM layer is connected to a power source or a ground through the aluminum mesh layer.

Example embodiment 2 based on the Example embodiment 1: The aluminum mesh layer is composed of a plurality of lines crossing each other to form a mesh structure.

Example embodiment 3 based on the Example embodiment 2: Some of the lines are substantially perpendicular to others of the lines.

Example embodiment 4 based on the Example embodiment 2: Some of the lines substantially have identical widths.

Example embodiment 5 based on the Example embodiment 1: The aluminum mesh layer has a plurality of holes arranged in a matrix to form a mesh structure.

Example embodiment 6 based on the Example embodiment 5: Some of the holes substantially have identical sizes.

Example embodiment 7 based on the Example embodiment 1: A thickness of the aluminum mesh layer is 1.4 to 2.8 um.

Example embodiment 8: A semiconductor device is provided. The semiconductor device includes a Radio Frequency (RF) circuit, at least one Ultra Thick Metal (UTM) layer and at least one copper mesh redistribution layer (RDL). The UTM layer is stacked on the RF circuit. The copper mesh RDL is stacked on the UTM layer, and the UTM layer is connected to a power source or a ground through the copper mesh RDL.

Example embodiment 9 based on the Example embodiment 8: The copper mesh RDL is composed of a plurality of lines crossing each other to form a mesh structure.

Example embodiment 10 based on the Example embodiment 8: Some of the lines are substantially perpendicular to others of the lines.

Example embodiment 11 based on the Example embodiment 10: Some of the lines substantially have identical widths.

Example embodiment 12 based on the Example embodiment 8: The copper mesh RDL has a plurality of holes arranged in a matrix to form a mesh structure.

Example embodiment 13 based on the Example embodiment 12: Some of the holes substantially have identical sizes.

Example embodiment 14 based on the Example embodiment 8: A thickness of the copper mesh RDL is 2.8 to 5.5 um.

Example embodiment 15: A semiconductor package structure is provided. The semiconductor package structure includes a semiconductor device and an interposer. The semiconductor device includes a Radio Frequency (RF) circuit and at least one Ultra Thick Metal (UTM) layer. The UTM layer is stacked on the RF circuit. The interposer includes at least one routing mesh layer. The interposer is stacked on the semiconductor device, and the UTM layer is connected to a power source or a ground through the routing mesh layer.

Example embodiment 16 based on the Example embodiment 15: The routing mesh layer is composed of a plurality of lines crossing each other to form a mesh structure.

Example embodiment 17 based on the Example embodiment 16: Some of the lines are substantially perpendicular to others of the lines.

Example embodiment 18 based on the Example embodiment 17: Some of the lines substantially have identical widths.

Example embodiment 19 based on the Example embodiment 15: The routing mesh layer has a plurality of holes arranged in a matrix to form a mesh structure.

Example embodiment 20 based on the Example embodiment 19: Some of the holes substantially have identical sizes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a Radio Frequency (RF) circuit;

at least one Ultra Thick Metal (UTM) layer, stacked on the RF circuit; and at least one aluminum mesh layer, wherein the at least one aluminum mesh layer is stacked on the at least one UTM layer, and the at least one UTM layer is connected to a power source or a ground through the at least one aluminum mesh layer.

2. The semiconductor device according to claim 1, wherein the at least one aluminum mesh layer is composed of a plurality of lines crossing each other to form a mesh structure.

3. The semiconductor device according to claim 2, wherein some of the plurality of lines are substantially perpendicular to others of the plurality of lines.

4. The semiconductor device according to claim 2, wherein some of the plurality of lines have substantially identical widths.

5. The semiconductor device according to claim 1, wherein the at least one aluminum mesh layer has a plurality of holes arranged in a matrix to form a mesh structure.

6. The semiconductor device according to claim 5, wherein some of the plurality of holes have substantially identical sizes.

7. The semiconductor device according to claim 5, wherein each of the plurality of holes is rectangular or circular.

8. The semiconductor device according to claim 1, wherein a thickness of the at least one aluminum mesh layer is 1.4 to 2.8 um.

9. A semiconductor package structure, comprising:

a semiconductor device, comprising:

a Radio Frequency (RF) circuit; and at least one Ultra Thick Metal (UTM) layer, stacked on the RF circuit; and an interposer, including at least one routing mesh layer, wherein the interposer is stacked on the semiconductor device, and the at least one UTM layer is connected to a power source or a ground through the at least one routing mesh layer.

10. The semiconductor package structure according to claim 9, wherein the at least one routing mesh layer is composed of a plurality of lines crossing each other to form a mesh structure.

11. The semiconductor package structure according to claim 10, wherein some of the plurality of lines are substantially perpendicular to others of the plurality of lines.

12. The semiconductor package structure according to claim 11, wherein some of the plurality of lines have substantially identical widths.

13. The semiconductor package structure according to claim 9, wherein the at least one routing mesh layer has a plurality of holes arranged in a matrix to form a mesh structure.

14. The semiconductor package structure according to claim 13, wherein some of the plurality of holes have substantially identical sizes.

15. A semiconductor package structure, comprising:

a semiconductor device, comprising:

a Radio Frequency (RF) circuit; and at least one Ultra Thick Metal (UTM) layer, stacked on the RF circuit; and two interposers, each including at least one routing mesh layer, wherein the two interposers are formed on two sides of the semiconductor device, and the at least one UTM layer is connected to a power source or a ground through the at least one routing mesh layer.

16. The semiconductor package structure according to claim 15, wherein the at least one routing mesh layer is composed of a plurality of lines crossing each other to form a mesh structure.

17. The semiconductor package structure according to claim 16, wherein some of the plurality of lines are substantially perpendicular to others of the plurality of lines.

18. The semiconductor package structure according to claim 17, wherein some of the plurality of lines have substantially identical widths.

19. The semiconductor package structure according to claim 15, wherein the at least one routing mesh layer has a plurality of holes arranged in a matrix to form a mesh structure.

20. The semiconductor package structure according to claim 19, wherein some of the plurality of holes have substantially identical sizes.

* * * * *